United States Patent
Minamio et al.

(10) Patent No.: US 9,240,369 B2
(45) Date of Patent: Jan. 19, 2016

(54) ENCAPSULATED SEMICONDUCTOR DEVICE AND METHOD FOR MANUFACTURING THE SAME

(71) Applicant: Panasonic Intellectual Property Management Co., Ltd., Osaka (JP)

(72) Inventors: Masanori Minamio, Osaka (JP); Tatsuo Sasaoka, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/682,709

(22) Filed: Apr. 9, 2015

(65) Prior Publication Data

US 2015/0235928 A1    Aug. 20, 2015

Related U.S. Application Data

(63) Continuation of application No. 13/697,886, filed as application No. PCT/JP2012/002089 on Mar. 26, 2012, now Pat. No. 9,030,003.

(30) Foreign Application Priority Data

Apr. 5, 2011    (JP) .................................. 2011-083300

(51) Int. Cl.
*H01L 23/10*    (2006.01)
*H01L 23/495*    (2006.01)
(Continued)

(52) U.S. Cl.
CPC ........ *H01L 23/49558* (2013.01); *H01L 21/565* (2013.01); *H01L 21/566* (2013.01);
(Continued)

(58) Field of Classification Search
CPC ............................ H01L 23/29; H01L 23/4334

USPC ........... 257/706, 713, 666, E23.101, E23.031
See application file for complete search history.

(56) References Cited

U.S. PATENT DOCUMENTS 4,890,152 A    12/1989 Hirata et al.
5,757,070 A *   5/1998 Fritz ................... H01L 23/4334
                                                                257/675

(Continued)

FOREIGN PATENT DOCUMENTS

DE    19655310 B4    11/2006
EP    0317310 A2    5/1989

(Continued)

OTHER PUBLICATIONS

Extended European Search Report issued in Application No. 12768445.4 with date completion of search Jun. 21, 2013.

(Continued)

*Primary Examiner* — Nitin Parekh
(74) *Attorney, Agent, or Firm* — McDermott Will & Emery LLP (57) ABSTRACT

An encapsulated semiconductor device includes: a first conduction path formative plate; a second conduction path formative plate joined to the first conduction path formative plate; a power element bonded to the first conduction path formative plate; a heatsink held by the first conduction path formative plate with an insulation sheet interposed between the heatsink and the first conduction path formative plate; and an encapsulation resin configured to encapsulate the first and second conduction path formative plates. A through hole or a lead gap is formed in a region of the first conduction path formative plate in contact with the insulation sheet. The insulation sheet is press-fitted into the through hole or the lead gap.

11 Claims, 8 Drawing Sheets

(51) Int. Cl.
  *H01L 23/433* (2006.01)
  *H01L 21/56* (2006.01)
  *H01L 23/29* (2006.01)
  *H01L 23/00* (2006.01)

(52) U.S. Cl.
  CPC .......... *H01L 23/29* (2013.01); *H01L 23/4334* (2013.01); *H01L 23/49537* (2013.01); *H01L 23/49562* (2013.01); *H01L 23/49568* (2013.01); *H01L 23/49575* (2013.01); *H01L 23/49586* (2013.01); *H01L 24/48* (2013.01); *H01L 2224/32245* (2013.01); *H01L 2224/48091* (2013.01); *H01L 2224/48247* (2013.01); *H01L 2224/73265* (2013.01); *H01L 2924/1301* (2013.01); *H01L 2924/1305* (2013.01); *H01L 2924/13055* (2013.01); *H01L 2924/13091* (2013.01); *H01L 2924/1815* (2013.01)

(56) References Cited

U.S. PATENT DOCUMENTS

| | | | |
|---|---|---|---|
| 5,792,676 A | 8/1998 | Masumoto et al. | |
| 5,834,842 A * | 11/1998 | Majumdar | H01L 23/3107 257/675 |
| 5,936,303 A * | 8/1999 | Nishi | H01L 23/4334 257/675 |
| 6,256,200 B1 * | 7/2001 | Lam | H01L 24/84 257/669 |
| 7,683,494 B1 | 3/2010 | Stortini et al. | |
| 8,222,651 B2 | 7/2012 | Kanazawa et al. | |
| 2005/0067719 A1 | 3/2005 | Hayashi et al. | |
| 2006/0108700 A1 | 5/2006 | Nakazawa et al. | |
| 2010/0091464 A1 | 4/2010 | Ohnishi et al. | |
| 2012/0014069 A1 * | 1/2012 | Zeng | H01L 23/4952 361/718 |

FOREIGN PATENT DOCUMENTS

| | | |
|---|---|---|
| EP | 767494 A2 | 4/1997 |
| EP | 0777272 A2 | 6/1997 |
| EP | 0777273 A2 | 6/1997 |
| JP | 05-243476 A | 9/1993 |
| JP | 09-102571 A | 4/1997 |
| JP | 2001-057406 A | 2/2001 |
| JP | 2001-358263 A | 12/2001 |
| JP | 2002-050713 A | 2/2002 |
| JP | 2003-045920 A | 2/2003 |
| JP | 2005-109100 A | 4/2005 |
| JP | 2006-147852 A | 6/2006 |
| WO | 2009-069308 A1 | 6/2009 |

OTHER PUBLICATIONS

English Translation of Chinese Search report for Application No. 201280001873.3.
U.S. Office Action issued in U.S. Appl. No. 13/697,886, dated Sep. 2, 2014.
U.S. Notice of Allowance issued in U.S. Appl. No. 13/697,886, dated Jan. 16, 2015.
International Search Report issued in PCT/JP2012/002089, dated Jul. 3, 2012, with English translation.
Extended European Search Report issued in Application No. 12768445.4 dated Jul. 1, 2013.

* cited by examiner

FIG.10
PRIOR ART

ENCAPSULATED SEMICONDUCTOR DEVICE AND METHOD FOR MANUFACTURING THE SAME

RELATED APPLICATIONS

This application is a Continuation of U.S. application Ser. No. 13/697,886, filed on Nov. 14, 2012, which is the U.S. National Phase under 35 U.S.C. §371 of International Application No. PCT/JP2012/002089, filed on Mar. 26, 2012, which in turn claims the benefit of Japanese Application No. 2011-083300, filed on Apr. 5, 2011, the disclosures of which Applications are incorporated by reference herein.

TECHNICAL FIELD

The present invention relates to encapsulated semiconductor devices allowing the passage of a large current therethrough, and methods for manufacturing the same.

BACKGROUND ART

Encapsulated semiconductor devices require the passage of a large current therethrough. Such an encapsulated semiconductor device has been utilized, e.g., to provide connection between a semiconductor switching element and a control circuit of an air conditioner, or to provide connection between batteries of an electric vehicle or between capacitors thereof.

Figure 10:
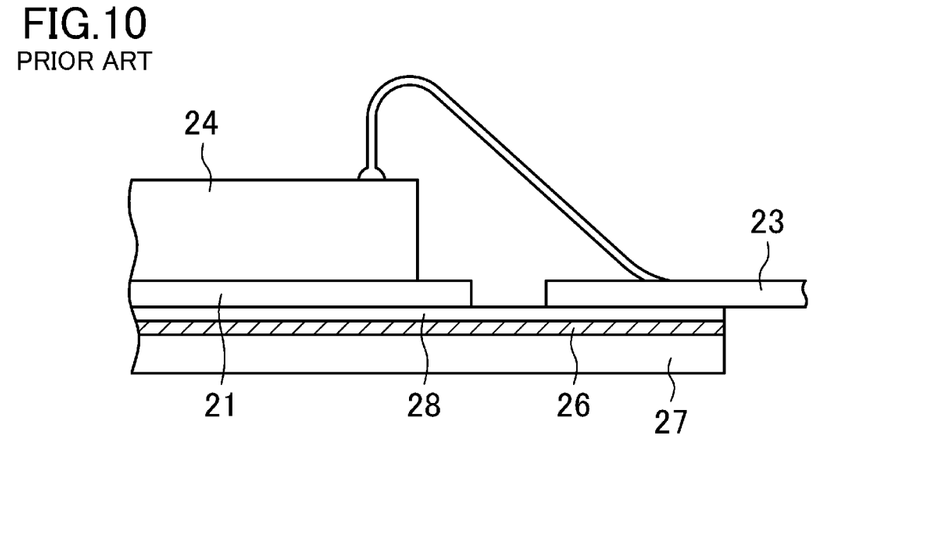
FIG. 10 is a schematic cross-sectional view illustrating a portion of a conventional semiconductor device.

FIG. 10 illustrates a schematic structure of a portion of a conventional semiconductor device described in PATENT DOCUMENT 1. As illustrated in FIG. 10, in the conventional semiconductor device, an island 21 to which a semiconductor element 24 is bonded, and an internal lead 23 are placed on a metal plate 27 for heat dissipation with a resin sheet 26 and a ceramic thin plate 28 interposed therebetween. Alumina or low-melting-point lead glass is suitable for the ceramic thin plate 28.

As such, the semiconductor device described in PATENT DOCUMENT 1 is configured such that the ceramic thin plate 28 is bonded to the back surface of the island 21 and the back surface of the internal lead 23, and furthermore, the metal plate 27 is bonded to the back surface of the ceramic thin plate 28 with the resin sheet 26 interposed therebetween. PATENT DOCUMENT 1 describes that since the semiconductor device described in PATENT DOCUMENT 1 includes the ceramic thin plate 28 between the resin sheet 26 and the island 21 or the internal lead 23, stable bonding of the internal lead 23 can be provided.

Furthermore, a semiconductor device described in PATENT DOCUMENT 2 includes a semiconductor element for power control, a metal base, and a lead frame serving as a conductor pattern. Here, the semiconductor element for power control forms a main circuit section. The metal base provides a heatsink effect for efficiently dissipating heat generated by the semiconductor element for power control to the outside. An insulative adhesion sheet is interposed between the lead frame serving as the conductor pattern and the metal base, and the lead frame serving as the conductor pattern provides connection between the semiconductor element for power control and a connecting wire.

CITATION LIST

Patent Document

PATENT DOCUMENT 1: Japanese Patent Publication No. H05-243476

PATENT DOCUMENT 2: Japanese Patent Publication No. 2001-358263

SUMMARY OF THE INVENTION

Technical Problem

However, the inventors' various experiments showed that the conventional semiconductor device might not exhibit sufficient insulation performance.

For example, a void (microvoid) may be formed between an island and an internal lead without filling the gap therebetween (gap between metal members with a potential difference) with an encapsulation resin material. In such a case, charges may be concentrated on opposed portions of the metal members facing each other with the void therebetween, and having a large potential difference therebetween, and thus, a short circuit may be caused.

To address this problem, an object of the present invention is to provide an encapsulated semiconductor device which can exhibit sufficient insulation performance, and a method for manufacturing the same.

Solution to the Problem

In order to achieve the above object, an encapsulated semiconductor device according to the present invention includes: a first conduction path formative plate having a through hole or a lead gap; a semiconductor element provided on the first conduction path formative plate; a heatsink; and an insulation sheet between the heatsink and the first conduction path formative plate. A portion of the insulation sheet is along an inner surface of the through hole or the lead gap.

Furthermore, in order to achieve the above object, a method for manufacturing an encapsulated semiconductor device according to the present invention includes: after preparing a first conduction path formative plate having a through hole or a lead gap and a second conduction path formative plate, allowing the first conduction path formative plate to hold a heatsink with an insulation sheet interposed between the first conduction path formative plate and the heatsink; press-fitting a portion of the insulation sheet into the through hole or the lead gap by pressing the first and second conduction path formative plates toward the heatsink; and encapsulating a portion of the first conduction path formative plate, a portion of the second conduction path formative plate, a portion of the insulation sheet, and a portion of the heatsink.

Advantages of the Invention

According to the present invention, an encapsulated semiconductor device exhibiting sufficient insulation performance, and a method for manufacturing the same can be achieved.

BRIEF DESCRIPTION OF THE DRAWINGS

FIG. 2(*a*) is a schematic cross-sectional view illustrating a resin encapsulated semiconductor device according to a variation of the embodiment of the present invention. FIG. 2(*b*) is a schematic bottom view illustrating the resin encapsulated semiconductor device according to the variation of the embodiment of the present invention.

DESCRIPTION OF EMBODIMENT

An embodiment of the present invention will be described with reference to the drawings. In the following description, the same reference characters are used to represent equivalent elements, and the explanation thereof will be omitted as appropriate.

Embodiment

Figure 1:
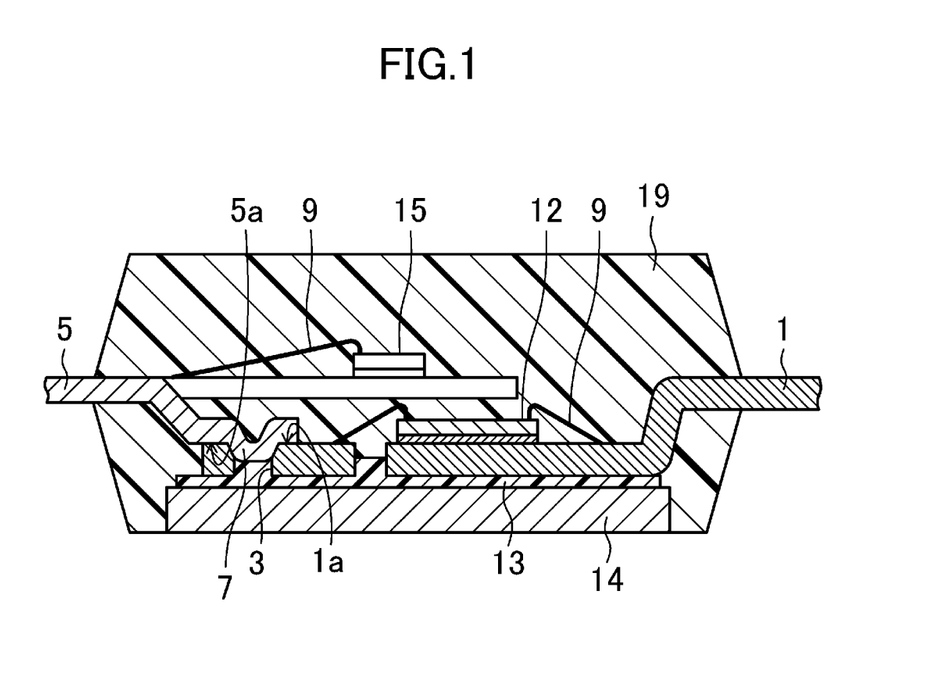
FIG. 1 is a schematic cross-sectional view illustrating a resin encapsulated semiconductor device according to an embodiment of the present invention.

FIG. 1 illustrates the structure of a cross section of a resin encapsulated semiconductor device according to an embodiment of the present invention. In the following description, one of second conduction path formative plates 5, wires 9, and a control element 15 are not present in this cross section; however, for ease of understanding, the elements are illustrated.

As illustrated in FIG. 1, a portion of an upper surface of a first conduction path formative plate 1 includes a first connection portion 1a. The first conduction path formative plate 1 is made of, e.g., plate-like copper (Cu). The first connection portion 1a is electrically connected to a second conduction path formative plate 5. A through hole 3 which will be described below with reference to FIGS. 5(a)-5(d) is formed in the first connection portion 1a.

A heatsink 14 is held on the back surface of the first conduction path formative plate 1 by an insulative heat dissipating sheet 13. The back surface of the first conduction path formative plate 1 is a surface thereof opposite to a surface thereof to which a power element 12 is bonded. The insulative heat dissipating sheet 13 is an example of an insulation sheet.

The second conduction path formative plate 5 placed on the upper surface of the first connection portion 1a is disposed above the first conduction path formative plate 1. The second conduction path formative plate 5 has a second connection portion 5a, and its main body is made of plate-like copper (Cu). However, as described below with reference to FIG. 6, a nickel plating film 6 is formed on the surface of the second conduction path formative plate 5.

The second connection portion 5a includes an insertion portion 7. The insertion portion 7 is a portion of the second conduction path formative plate 5 inserted into the interior of the through hole 3.

Figure 7A:
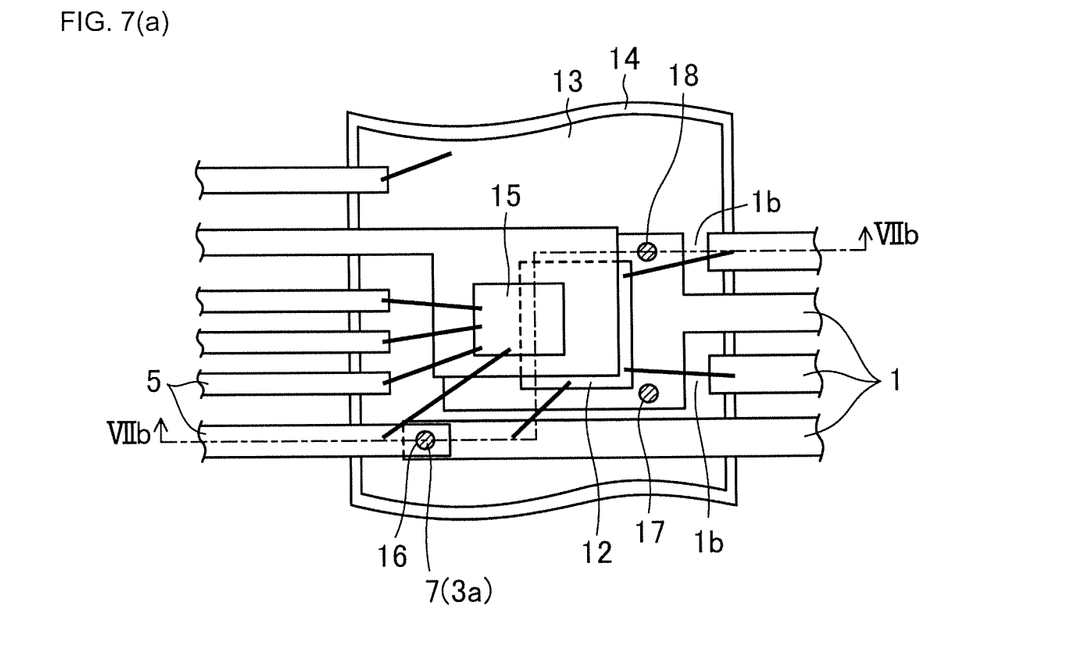
FIG. 7(a) is a schematic plan view illustrating a process step in the method for manufacturing a resin encapsulated semiconductor device according to the variation of the embodiment of the present invention.
Figure 7B:
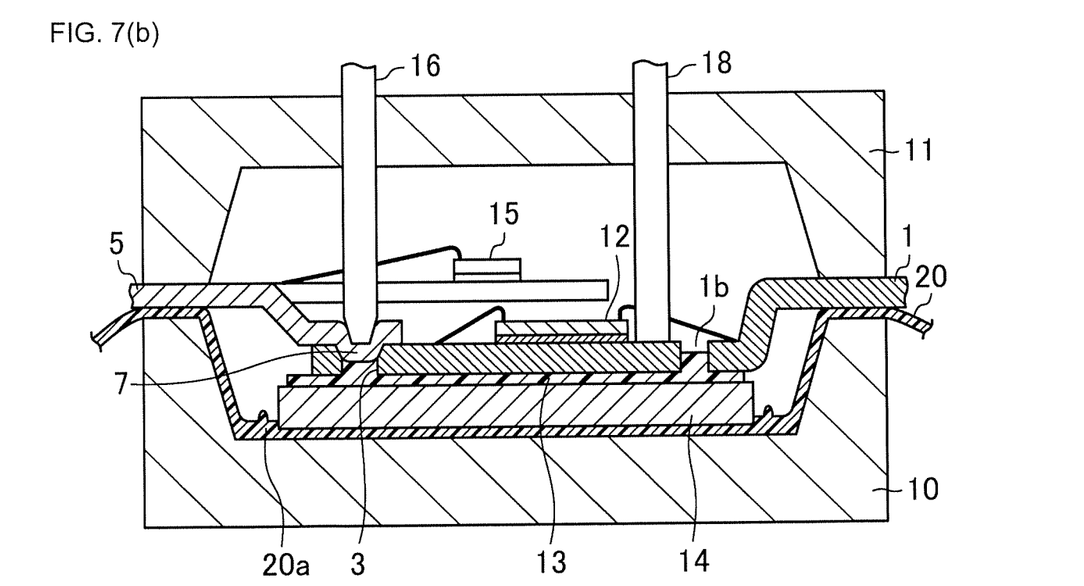
FIG. 7(b) is a schematic cross-sectional view taken along the line VIIb-VIIb in FIG. 7(a).

The resin encapsulated semiconductor device of this embodiment is configured to allow portions of the insulative heat dissipating sheet 13 to flow into the through hole 3 into which the insertion portion 7 is inserted and gaps 1b (see FIGS. 7(a) and 7(b)). This advantage will be described below. The portions of the insulative heat dissipating sheet 13 flowing into the through hole 3 and the gaps 1b by press-fitting the insulative heat dissipating sheet 13 thereinto is referred hereinafter to as press-fit portions. The resin encapsulated semiconductor device is an example of an encapsulated semiconductor device.

Figure 6:
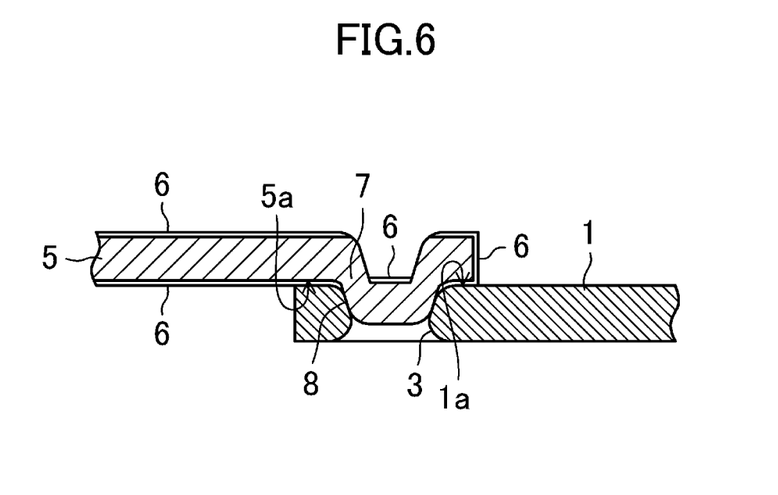
FIG. 6 is an enlarged cross-sectional view illustrating the insertion portion (junction portion) in the method for manufacturing a resin encapsulated semiconductor device according to the variation of the embodiment of the present invention.

As illustrated in FIG. 6, an inclined junction interface 8 is formed between the inner surface of the through hole 3 formed in the first conduction path formative plate 1 and the outer (side) surface of the insertion portion 7 of the second conduction path formative plate 5. The inclined junction interface 8 is formed by inserting the insertion portion 7 into the interior of the through hole 3. Specifically, the inclined junction interface 8 is a junction interface inclined relative to a surface of the first conduction path formative plate 1 on which the second conduction path formative plate 5 is placed (the upper surface of the first conduction path formative plate 1). In other words, in this embodiment, the junction interface between the first conduction path formative plate 1 and the second conduction path formative plate 5 is the inclined junction interface 8 which is inclined relative to a horizontal plane. In this embodiment, the junction interface therebetween is the inclined junction interface 8, thereby allowing the junction interface to have a larger area than when the junction interface is not inclined.

Furthermore, in this embodiment, the insertion portion 7 of the second conduction path formative plate 5 is formed by caulking. Thus, the inner surface of the through hole 3 and the outer surface of the insertion portion 7 at the inclined junction interface 8 both form metal flow surfaces onto which a metal flows. This provides, not simple contact between the inner surface of the through hole 3 and the outer surface of the insertion portion 7, but integral connection between the copper metals. This can provide extremely low electrical resistance between the first connection portion 1a and the second connection portion 5a.

The power element 12 is bonded onto the first conduction path formative plate 1 using a solder material. The control element 15 is bonded onto a second conduction path formative plate 5 using a solder material. The power element 12 is electrically connected through wires 9 to the first conduction path formative plate 1. The control element 15 is electrically connected through another wire 9 to the corresponding second conduction path formative plate 5. Here, for example, an insulated gate bipolar transistor (IGBT) or a metal-oxide-semiconductor field-effect transistor (MOSFET) can be used as the power element 12.

Portions of the first conduction path formative plates 1, portions of the second conduction path formative plates 5, the power element 12, the control element 15, the insulative heat dissipating sheet 13, a portion of an upper surface of the heatsink 14, and side surfaces thereof are encapsulated by an encapsulation resin 19. A lower surface of the heatsink 14 is exposed from the encapsulation resin 19 to dissipate heat.

Variation of Embodiment

Figure 2A:
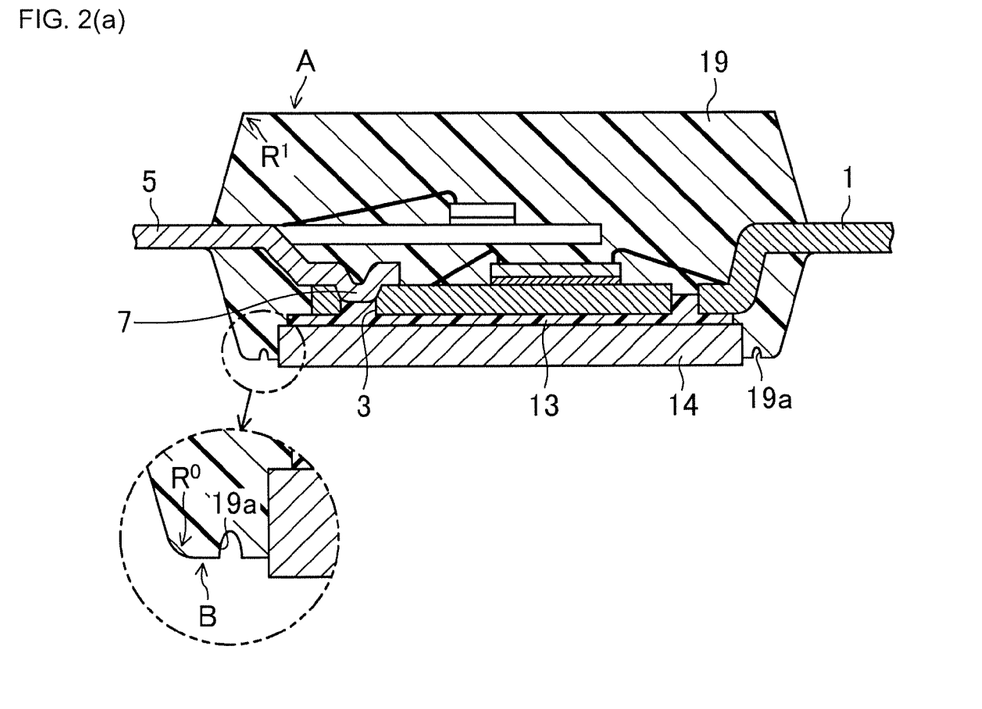
Figure 2B:
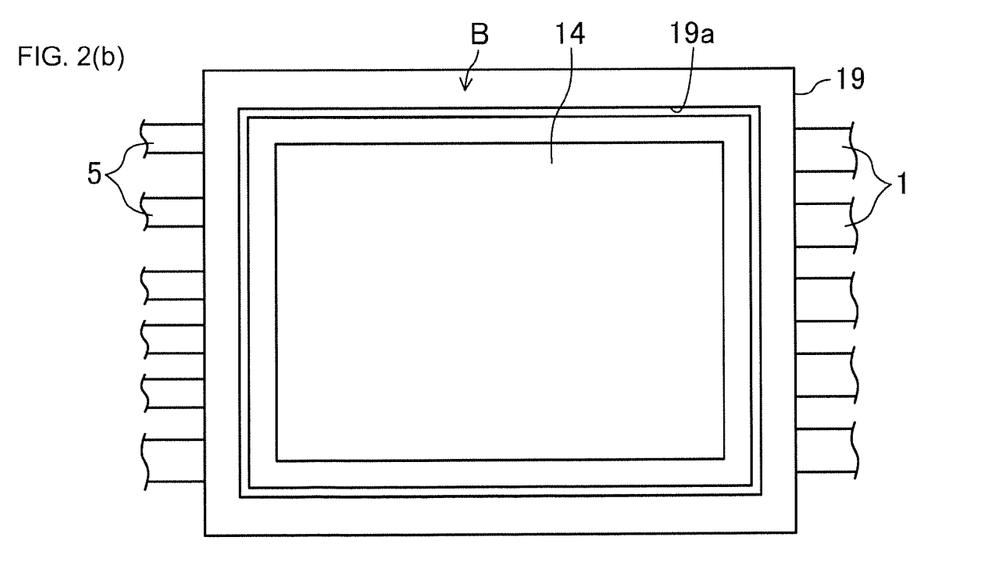
Figure 3:
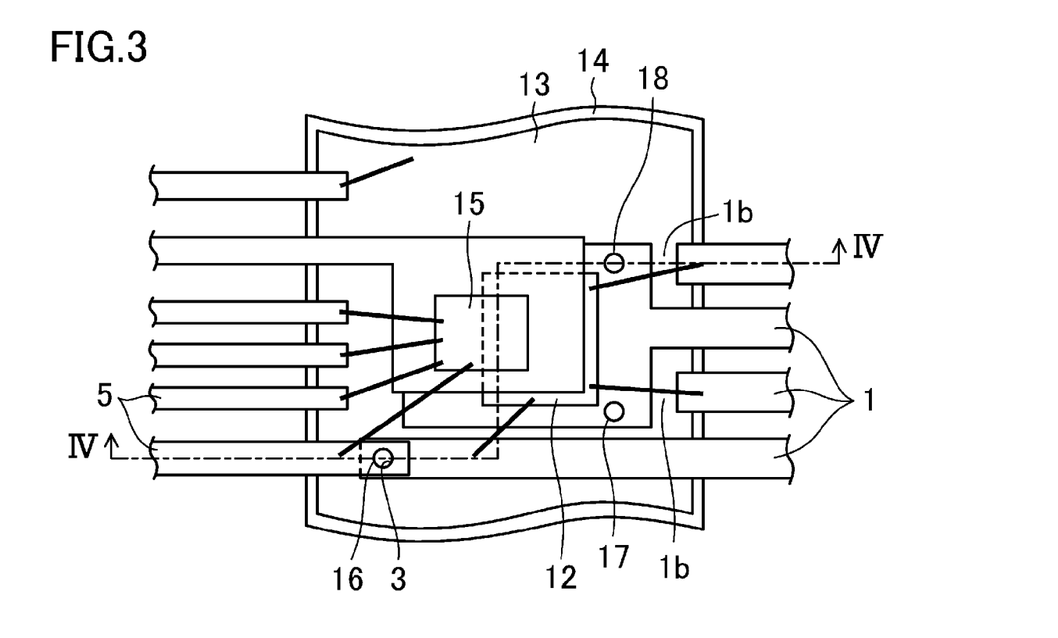
FIG. 3 is a schematic plan view illustrating a process step in a method for manufacturing a resin encapsulated semiconductor device according to the variation of the embodiment of the present invention.

FIGS. 2(a) and 2(b) illustrate a resin encapsulated semiconductor device according to a variation of the embodiment.

As illustrated in FIGS. 2(a) and 2(b), the resin encapsulated semiconductor device according to this variation includes a sheet groove 19a formed in the bottom surface B of the encapsulation resin 19 to surround the heatsink 14. The sheet groove 19a results from an elastic resin sheet 20 (see FIG. 4) interposed between an inner surface of a lower mold and the heatsink 14 during manufacturing of the resin encapsulated semiconductor device. The width and depth of the sheet groove 19a are each greater than half of the thickness of the elastic resin sheet 20.

Furthermore, as illustrated in FIG. 2(a), since, in this variation, resin encapsulation is performed with the elastic resin sheet 20 interposed between the lower mold and the heatsink 14, the radius $R^0$ of curvature of a corner portion of the bottom surface B of the encapsulation resin 19 is larger than the radius $R^1$ of curvature of an upper surface A of the encapsulation resin 19.

Although described below in detail, the interposition of the elastic resin sheet 20 between the lower mold and the heatsink 14 (see FIG. 4) as in this variation can reduce the pressing forces with which the lower mold and an upper mold are pressed against each other.

Manufacturing Method

A method for manufacturing a resin encapsulated semiconductor device according to the variation of this embodiment will be described hereinafter with reference to FIGS. 3-8.

First, a power element 12 is previously placed on an upper surface of one of first conduction path formative plates 1 (e.g., an upper surface of a die pad). Similarly, a control element 15 configured to control operation of the power element 12 is previously placed on an upper surface of one of second conduction path formative plates 5 (e.g., an upper surface of a die pad). A heatsink 14 is held on lower surfaces of the first conduction path formative plates 1 while, e.g., an insulative heat dissipating sheet 13 made of a polyimide resin is interposed therebetween. In this stage, the first and second conduction path formative plates 1 and 5 both correspond to lead frames. In this case, for example, a through hole 3 exists in a corresponding one of the first conduction path formative plates 1, gaps 1b exist between adjacent ones of the leads, i.e., the first conduction path formative plates 1, and the through hole 3 and the gaps 1b may each include a void (microvoid) without being filled with an encapsulation resin 19. In other words, as described above, a void (microvoid) may be formed in each of the through hole 3 and the gaps 1b without filling the through hole 3 or the gap 1b with the encapsulation resin 19.

Figure 4:
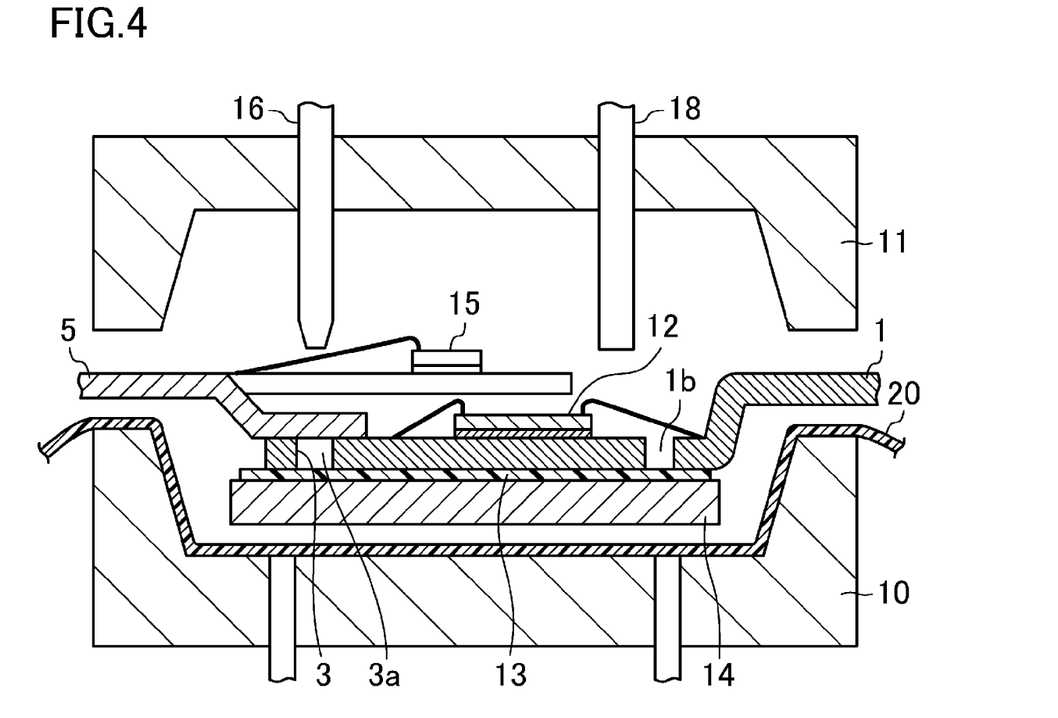
FIG. 4 is a schematic cross-sectional view illustrating the method for manufacturing a resin encapsulated semiconductor device according to the variation of the embodiment of the present invention, and taken along the line IV-IV in FIG. 3.

Next, as illustrated in FIG. 4, an elastic resin sheet 20 is placed on an inner surface of a lower mold 10. For example, polyethylene terephthalate (PET) can be used as the elastic resin sheet 20. When the elastic resin sheet 20 has a size large enough to cover the inner surface of the lower mold 10, it may be previously bonded to a lower surface of the heatsink 14.

Next, the first conduction path formative plates 1 holding the heatsink 14, and the second conduction path formative plates 5 are disposed between an upper mold 11 and the lower mold 10. The upper mold 11 includes three holding pins 16, 17, and 18. Among these pins, the holding pin 16 is provided to perform a caulking process described below with reference to FIGS. 5(a)-5(d). In order to form an insertion portion 7 by a caulking process, the holding pin 16 is formed to have a tapered distal end portion as illustrated in FIG. 4. In contrast, in order to hold a corresponding one of the first conduction path formative plates 1 while evenly pressing the corresponding first conduction path formative plate 1 downward, the other holding pins 17 and 18 are formed to each have a flat distal end.

A method in which the insertion portion 7 is formed by inserting a corresponding one of the second conduction path formative plates 5 into the through hole 3 of the corresponding first conduction path formative plate 1 will be described in detail with reference to FIGS. 5(a)-5(d).

Figure 5A:
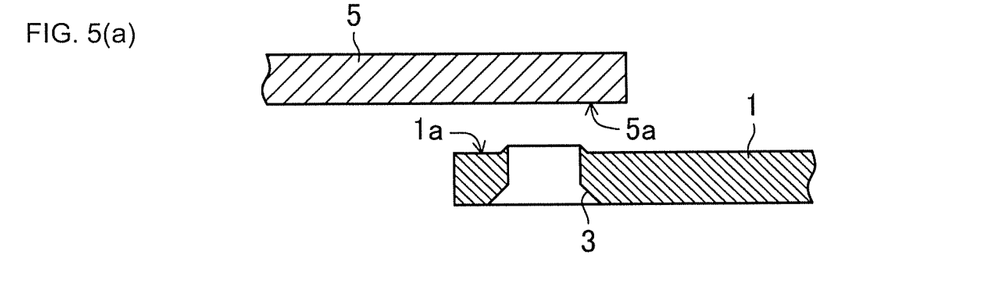
FIGS. 5(a)-5(d) are enlarged cross-sectional views illustrating a process step of forming an insertion portion (junction portion) in the method for manufacturing a resin encapsulated semiconductor device according to the variation of the embodiment of the present invention.

First, as illustrated in FIG. 5(a), the first and second conduction path formative plates 1 and 5 are disposed in the lower mold 10 with a lower surface of a second connection portion 5a of a corresponding one of the second conduction path formative plates 5 placed on an upper surface of a first connection portion 1a of a corresponding one of the first conduction path formative plates 1.

Figure 5B:
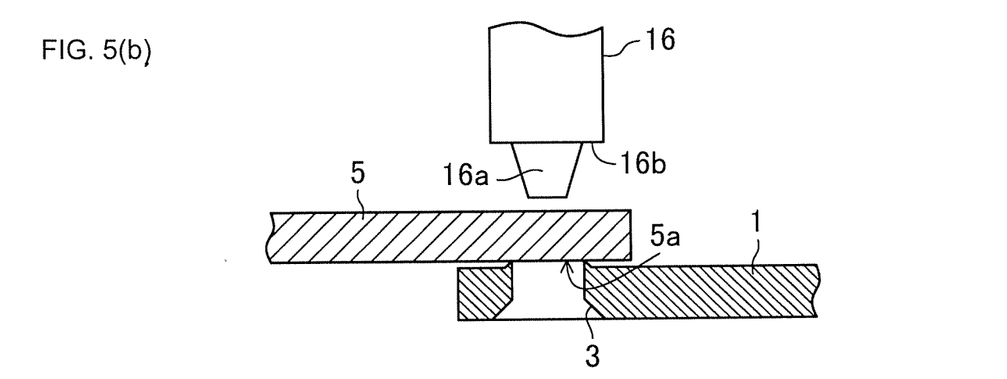
Figure 5C:
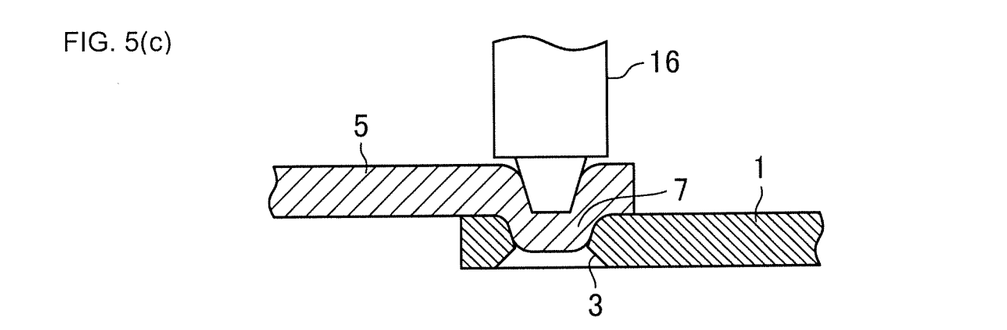

Next, as illustrated in FIGS. 5(b) and 5(c), a portion of the second connection portion 5a is inserted into the through hole 3 with the holding pin 16. In this case, the holding pin 16 functions as a punch. Here, the portion of the second connection portion 5a inserted into the through hole 3 is a portion of the second connection portion 5a facing the through hole 3. Here, the through hole 3 of the corresponding first conduction path formative plate 1 is formed by passing a tool from the surface of the first conduction path formative plate 1 opposite to the corresponding second conduction path formative plate 5 (the lower side of each of these figures) to the surface thereof near the corresponding second conduction path formative plate 5 (the upper side of each of these figures). Therefore, as illustrated in FIG. 5(a), an R portion (so-called roll over) tapered upward is formed in a lower end portion of the through hole 3. In the variation of this embodiment, this R portion reduces the possibility of electric field concentration in the lower end portion of the through hole 3. As illustrated in FIG. 5(a), a portion of the first conduction path formative plate 1 having an acute angle (so-called burr) is formed on the edge of an upper end portion of the through hole 3.

A distal end portion of the holding pin 16 has a pin insertion portion 16a and a pin press portion 16b. The flat second connection portion 5a is inserted into the interior of the through hole 3 with the pin insertion portion 16a. The pin press portion 16b is a portion of the holding pin 16 around the pin insertion portion 16a, and presses a portion of the second conduction path formative plate 5 outside the through hole 3 toward the first conduction path formative plate 1.

When the flat second connection portion 5a is inserted into the interior of the through hole 3 with the pin insertion portion 16a, the use of such a holding pin 16 allows the pin press portion 16b to press a flat portion of the second connection portion 5a down toward the corresponding first conduction path formative plate 1. This can prevent the second connection portion 5a from being upwardly separated from the first conduction path formative plate 1.

Figure 5D:
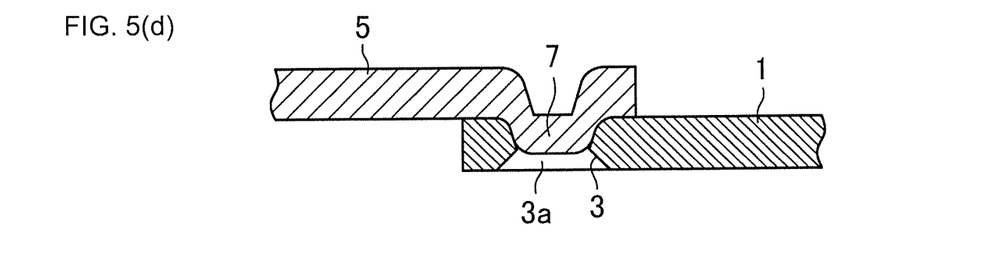

As a result, the insertion portion 7 having an outer portion in contact with the corresponding first conduction path formative plate 1 is formed in the interior of the through hole 3. Furthermore, an inclined junction interface 8 (see FIG. 6) inclined relative to the surface of the first conduction path formative plate 1 on which the corresponding second conduction path formative plate 5 is placed (the upper surface of the first conduction path formative plate 1) is formed between the inner surface of the through hole 3 and the outer surface of the insertion portion 7 by inserting the insertion portion 7 into the interior of the through hole 3. Here, as illustrated in FIG. 5(d), a space 3a is formed in a lower portion of the through hole 3 into which the insertion portion 7 is inserted.

Since, as described above, the inner surface of the through hole 3 and the outer surface of the insertion portion 7 at the inclined junction interface 8 both form metal flow surfaces, the electrical resistance between the first connection portion 1a and the second connection portion 5a is extremely low.

This point will be described in more detail.

Each of the first conduction path formative plates 1 is made of copper. Under normal storage conditions, an oxide film (not shown) is formed on the entire surface of the first conduction path formative plate 1. Immediately after the formation of the through hole 3, an oxide film (not shown) is formed also on the inner surface of the through hole 3. In contrast, each of the second conduction path formative plates 5 includes a nickel plating film 6 formed on the surface of copper as illustrated in FIG. 6.

When, as such, one of the second conduction path formative plates 5 being a copper plate with a surface on which the nickel plating film 6 is formed is inserted into the through hole 3 of the corresponding first conduction path formative plate 1, the insertion portion 7 of the second conduction path formative plate 5 is inserted into the interior of the through hole 3 while the nickel plating film 6 on the surface of the insertion portion 7 rubs against the oxide film on the inner surface of the through hole 3. The hardness of the nickel plating film 6 (Vickers hardness: 150-700 Hv) is higher than that of a copper oxide film obtained by oxidation of the copper (Vickers hardness: about 120 Hv). Therefore, when the nickel plating film 6 and the copper oxide film rub against each other, the copper oxide film on the inner surface of the through hole 3 is scraped off by the nickel plating film 6 with a higher hardness. Specifically, when the insertion portion 7 is inserted into the interior of the through hole 3, the copper oxide film on the inner surface of the through hole 3 is scraped off by the nickel plating film 6 on the insertion portion 7.

In this embodiment, the plate thickness of each of the second conduction path formative plates 5 is smaller than that of each of the first conduction path formative plates 1. Thus, the insertion portion 7 of the corresponding second conduction path formative plate 5 can be easily inserted into the through hole 3 of the corresponding first conduction path formative plate 1 by the pin insertion portion 16a of the holding pin 16.

Next, the upper mold 11 is moved down, and as illustrated in FIG. 7(b), the upper mold 11 is disposed on the lower mold 10. In this case, the three holding pins 16, 17, and 18 are simultaneously moved down from the upper mold 11 to the lower mold 10.

As illustrated in FIG. 7(a), with the configuration of the semiconductor device of this embodiment, the holding pins 16, 17, and 18 are disposed to allow uniform pressure application to the corresponding first and second conduction path formative plates 1 and 5. The location of the holding pin 16 is defined to form the insertion portion 7. Thus, the holding pins 17 and 18 need to be located to provide a balance between their pressing forces at the corresponding pressed locations and the pressing force of the holding pin 16 at the pressed location. Furthermore, the holding pins 17 and 18 need to be located such that the space 3a formed in the through hole 3 and the gaps 1b between adjacent ones of the leads being the first conduction path formative plates 1 can be filled with the insulative heat dissipating sheet 13 by press-fitting the insulative heat dissipating sheet 13 into the space 3a and the gaps 1b. Here, the press-fitting means that the insulative heat dissipating sheet 13 rendered flowable by heat flows into the through hole 3 and the gaps 1b so as to be in contact with the inner surfaces of the through hole 3 and the gaps 1b.

Specifically, the holding pin 16 needs to be located on a portion of the corresponding second conduction path formative plate 5 over the through hole 3. The holding pins 17 and 18 need to be located in the vicinity of the gaps 1b between adjacent ones of the leads being the first conduction path formative plates 1. For example, in this embodiment, the two gaps 1b between adjacent ones of the leads are formed between two corner portions of a die pad portion of the corresponding first conduction path formative plate 1 and two of the first conduction path formative plates 1 serving as the leads exposed to the outside. Therefore, the holding pins 17 and 18 are disposed on the two corner portions of the die pad portion. As the number of the first conduction path formative plates 1 exposed to the outside increases, the number of holding pins is preferably increased, and holding pins are preferably disposed at corresponding locations.

In this embodiment, when the corresponding first conduction path formative plates 1 and the corresponding second conduction path formative plate 5 are pressed by the holding pins 16, 17, and 18, the lower mold 10 and the upper mold 11 are heated.

When, as such, the first and second conduction path formative plates 1 and 5 are pressed toward the lower mold 10 simultaneously by the plurality of holding pins 16, 17, and 18, portions of the insulative heat dissipating sheet 13 made of a polyimide resin are press-fitted into the space 3a formed in the through hole 3 and the gaps 1b between adjacent ones of the leads. As a result, as illustrated in FIG. 7(b), the space 3a and the gaps 1b between adjacent ones of the leads are filled with the portions of the insulative heat dissipating sheet 13 serving as press-fit portions.

Here, the filling of the space 3a of the through hole 3 with the insulative heat dissipating sheet 13 means that the insulative heat dissipating sheet 13 is in contact with at least one portion of the insertion portion 7 inside the through hole 3. In this case, the insulative heat dissipating sheet 13 is preferably in contact with the entire surface of the insertion portion 7 inside the through hole 3. In this state, corner portions of the corresponding first conduction path formative plate 1 (lead) are partially embedded in the insulative heat dissipating sheet 13.

Furthermore, when each of the gaps 1b between adjacent ones of the leads is filled with the insulative heat dissipating sheet 13, it is filled with a portion of the insulative heat dissipating sheet 13 having a volume larger than or equal to 30% of the volume of the gap 1b. In this case, the gap 1b is preferably filled with a portion of the insulative heat dissipating sheet 13 having a volume larger than or equal to 50% of the volume of the gap 1b.

The insulative heat dissipating sheet 13 of this embodiment is made of a material having a glass transition temperature Tg higher than or equal to 160° C. and equal to or lower than 200° C., and having an elastic modulus higher than or equal to 10 GPa when heated in order to fill the space 3a and the gaps 1b with the insulative heat dissipating sheet 13 while heating the lower and upper molds 10 and 11.

In order to uniformly fill the space 3a with the insulative heat dissipating sheet 13, the pressing force of each of the holding pins 16, 17, and 18 is greater than or equal to 4.9 N, and the pressing forces of the three holding pins are preferably identical. The pressing forces are the forces required to allow the insertion portion 7 of the corresponding second conduction path formative plate 5 to be in contact with one of the press-fit portions of the insulative heat dissipating sheet 13 with which the through hole 3 is filled. Specifically, the pressing forces are the forces required to prevent the space 3a from remaining in a portion of the through hole 3 between the insertion portion 7 and the corresponding press-fit portion of the insulative heat dissipating sheet 13.

The pressing forces are the forces required also to crush and eliminate a portion of the corresponding first conduction path formative plate 1 having an acute angle (so-called burr) and formed on the edge of an upper end portion of the through hole 3 as illustrated in FIG. 5(a). Furthermore, the pressing forces are the forces required also to fill the gaps 1b between the corner portions of the die pad portion of the corresponding first conduction path formative plate 1 and some of the first conduction path formative plates 1 serving as external leads with the insulative heat dissipating sheet 13. Here, the gaps 1b are preferably filled with the insulative heat dissipating sheet 13 to the extent that a void does not remain between the encapsulation resin 19 injected into the gaps 1b to provide encapsulation in a later process step and the insulative heat dissipating sheet 13.

Figure 8:
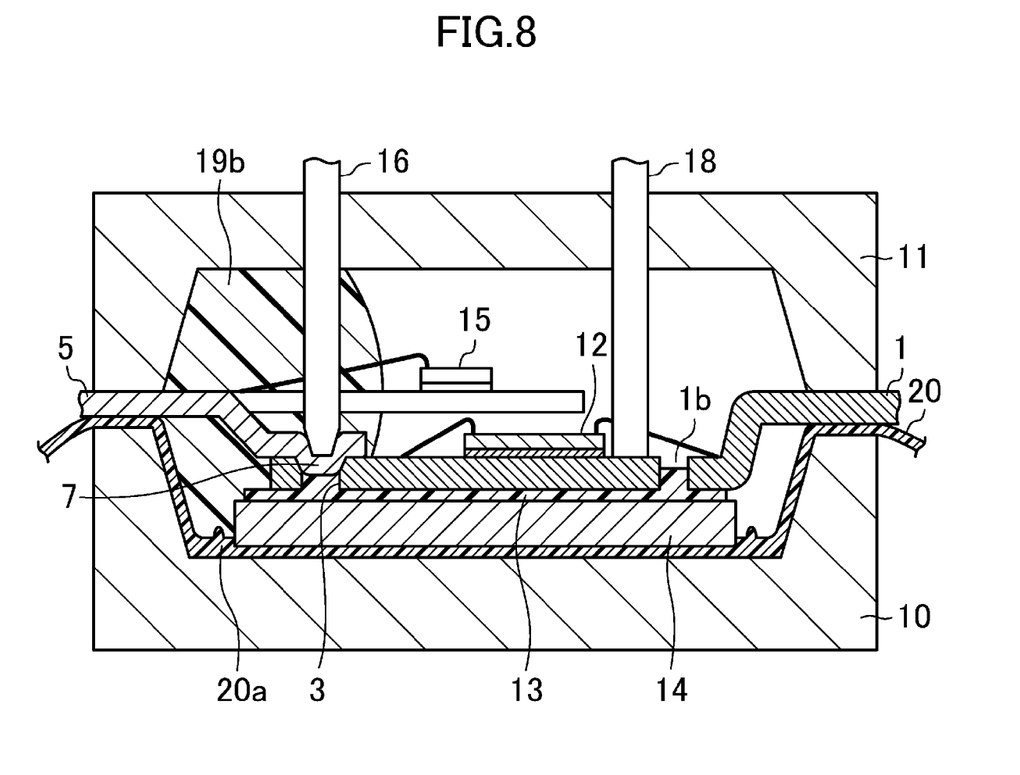
FIG. 8 is a schematic cross-sectional view illustrating a process step in the method for manufacturing a resin encapsulated semiconductor device according to the variation of the embodiment of the present invention.

Next, as illustrated in FIG. 8, a flowable encapsulation resin 19b is injected between the heated lower and upper molds 10 and 11. In this case, the heatsink 14 pressed down by the holding pins 16, 17, and 18 is held while being partially embedded in the elastic resin sheet 20 placed on the lower mold 10. The embedment of the heatsink 14 allows the elastic resin sheet 20 to have a sheet wrinkle 20a formed around the heatsink 14. When the encapsulation resin 19 from which the elastic resin sheet 20 is separated is removed from the molds 10 and 11, the sheet groove 19a is formed in the bottom surface B of the encapsulation resin 19 by the sheet wrinkle 20a as illustrated in FIGS. 2(a) and 2(b).

As such, the interposition of the elastic resin sheet 20 between the lower mold 10 and the heatsink 14 can reduce the pressing forces with which the lower and upper molds 10 and 11 are pressed against each other.

The sheet groove 19a is formed around the heatsink 14 by the sheet wrinkle 20a, and thus, when the semiconductor device is implemented on a set heatsink, grease with which the heatsink 14 or the set heatsink is coated can be prevented from leaking. The sheet groove 19a is an example groove.

In view of the above, the resin encapsulated semiconductor device illustrated in FIG. 2(a) can be manufactured. The resin encapsulated semiconductor device is configured such that portions of the first conduction path formative plates 1, portions of the second conduction path formative plates 5, the power element 12, the control element 15, the insulative heat dissipating sheet 13, and exposed portions of the upper surface of the heatsink 14, and exposed side surfaces thereof are encapsulated by the encapsulation resin 19, and the lower surface of the heatsink 14 is exposed from the encapsulation resin 19.

Figure 9:
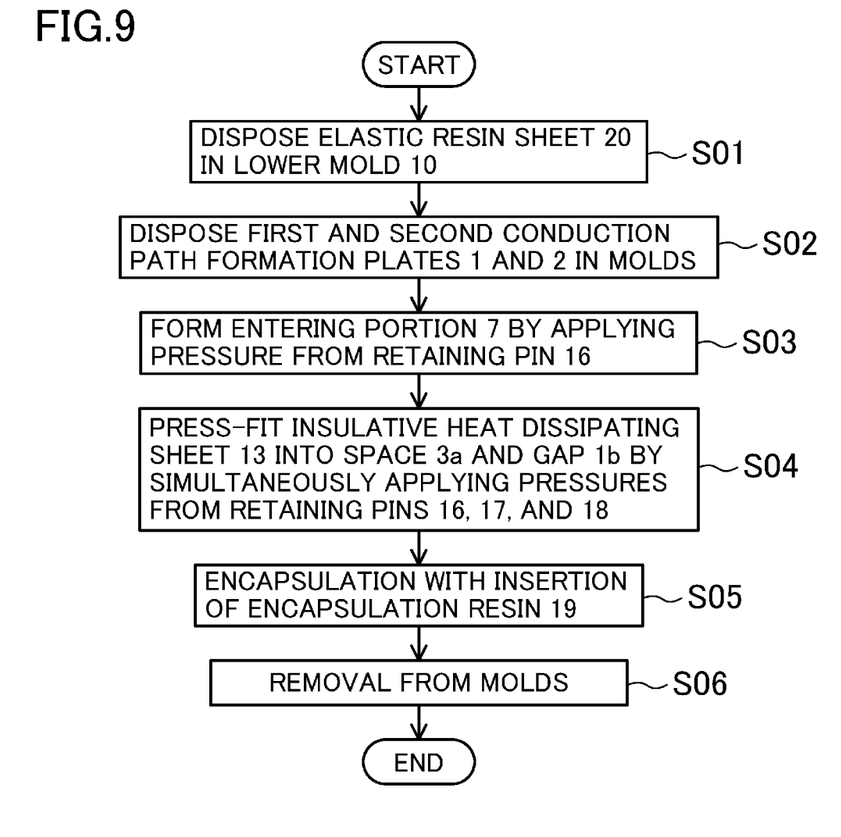
FIG. 9 is a flow chart illustrating the method for manufacturing a resin encapsulated semiconductor device according to the variation of the embodiment of the present invention.

Process steps in the above-described manufacturing method of the variation will be described with reference to the flow chart illustrated in FIG. 9.

First, in step S01, an elastic resin sheet 20 is placed on an inner surface of a lower mold 10. As described above, the elastic resin sheet 20 may be previously bonded to a lower surface of a heatsink 14. Specifically, in step S01, the elastic resin sheet 20 is disposed on the inner surface of the lower mold 10.

Next, in step S02, the heatsink 14 on which an insulative heat dissipating sheet 13 is held, a first conduction path formative plate 1 to which a power element 12 is bonded, and a second conduction path formative plate 5 to which a control element 15 is bonded are disposed in the lower mold 10 and an upper mold 11 (between the upper mold 11 and the lower mold 10). Here, the first conduction path formative plate 1 to which the power element 12 is bonded, and the second conduction path formative plate 5 to which the control element 15 is bonded are previously prepared.

Next, in step S03, as illustrated in FIGS. 5(b)-5(d), a portion of a second conduction path formative plate 5 over a through hole 3 of a first conduction path formative plate 1 is pressed by a holding pin 16, thereby forming an insertion portion 7.

Next, in step S04, as illustrated in FIGS. 7(a) and 7(b), the first and second conduction path formative plates 1 and 2 are simultaneously pressed down by the holding pin 16, and holding pins 17 and 18. Thus, the insulative heat dissipating sheet 13 is press-fitted into a space 3a in the through hole 3 and gaps 1b between adjacent ones of leads. Specifically, the space 3a in the through hole 3 and the gaps 1b between adjacent ones of the leads are filled with the insulative heat dissipating sheet 13.

Next, in step S05, as illustrated in FIG. 8, a heated encapsulation resin 19b is injected between the lower and upper molds 10 and 11 while the space 3a in the through hole 3 and the gaps 1b between adjacent ones of the leads are filled with the insulative heat dissipating sheet 13. Thus, the interiors of the molds 10 and 11 are encapsulated by an encapsulation resin 19.

Next, in step S06, the resin encapsulated semiconductor device illustrated in FIGS. 2(a) and 2(b) is obtained by being removed from the cooled molds.

As above, through steps S01-S06, the resin encapsulated semiconductor device according to the variation of this embodiment can be manufactured. In the method for manufacturing a resin encapsulated semiconductor device according to this variation, the interposition of the elastic resin sheet 20 between the lower mold 10 and the heatsink 14 can reduce the pressing forces with which the lower and upper molds 10 and 11 are pressed against each other.

In this variation, in step S03, the insertion portion 7 is formed from the corresponding second conduction path formative plate 5 by the holding pin 16 with the heatsink 14, and the first and second conduction path formative plates 1 and 5 disposed between the upper and lower molds 11 and 10. However, the procedure of the formation of the insertion portion 7 is not limited to the above procedure. For example, the insertion portion 7 may be formed using a punch outside the molds before being placed in the molds.

In a manufacturing method in which no elastic resin sheet 20 is interposed between the lower mold 10 and the heatsink 14, the resin encapsulated semiconductor device illustrated in FIG. 1 can be obtained by omitting step S01.

In each of the above-described resin encapsulated semiconductor devices according to this embodiment and its variation, the through hole 3 formed in the corresponding first conduction path formative plate 1 and the gaps 1b formed between adjacent ones of the first conduction path formative plates 1 are filled with portions of the insulative heat dissipating sheet 13. This can reduce the possibility of electric field concentration in the through hole 3 and the gaps 1b between adjacent ones of the leads. Therefore, even when the conduction path formative plate in which the through hole 3 exist, and the conduction path formative plates between adjacent ones of which the gaps 1b exist is encapsulated with resin, each of the resin encapsulated semiconductor devices according to this embodiment and its variation can exhibit sufficient insulation performance.

INDUSTRIAL APPLICABILITY

The encapsulated semiconductor device according to the present invention can be utilized, e.g., to provide connection between a semiconductor switching element and a control circuit of an air conditioner, or to provide series or parallel connection between batteries of an electric vehicle or between capacitors thereof, and such connection allows the passage of a large current through the encapsulated semiconductor device.

DESCRIPTION OF REFERENCE CHARACTERS

1 FIRST CONDUCTION PATH FORMATIVE PLATE
1a FIRST CONNECTION PORTION
1b GAP
3 THROUGH HOLE
3a SPACE
5 SECOND CONDUCTION PATH FORMATIVE PATH
5a SECOND CONNECTION PORTION
6 NICKEL PLATING FILM
7 INSERTION PORTION
8 INCLINED JUNCTION INTERFACE
9 WIRE
10 LOWER MOLD
11 UPPER MOLD
12 POWER ELEMENT
13 INSULATIVE HEAT DISSIPATING SHEET
14 HEATSINK
15 CONTROL ELEMENT
16, 17, 18 HOLDING PIN
16a PIN INSERTION PORTION
16b PIN PRESS PORTION
19 ENCAPSULATION RESIN
19a SHEET GROOVE
19b ENCAPSULATION RESIN
20 ELASTIC RESIN SHEET
20a SHEET WRINKLE

The invention claimed is:

1. A semiconductor device comprising:
a first conduction path formative plate having a through hole or a lead gap;
a semiconductor element provided on the first conduction path formative plate;
a heatsink; and
an insulation sheet between the heatsink and the first conduction path formative plate, wherein
a portion of the insulation sheet is along an inner surface of the through hole or the lead gap, and
a distal end of the portion of the insulation sheet is located within the through hole or the lead gap when viewed in cross-section in a thickness direction of the semiconductor device.

2. The semiconductor device of claim 1, further comprising:
a second conduction path formative plate connected to the first conduction path formative plate.

3. The semiconductor device of claim 2, further comprising:
an encapsulation resin configured to encapsulate the first and second conduction path formative plates.

4. The semiconductor device of claim 3, wherein
the through hole or the lead gap includes no void between the encapsulation resin and the insulation sheet.

5. The semiconductor device of claim 3, wherein the encapsulation resin has a groove around the heatsink.

6. The semiconductor device of claim 2, wherein
an insertion portion of the second conduction path formative plate in the through hole is joined to the first conduction path formative plate, and
the distal end of the insulation sheet is in contact with the insertion portion of the second conduction path formative plate in the through hole.

7. The semiconductor device of claim 1, wherein
the lead gap is filled with a portion of the insulation sheet having a volume larger than or equal to 30% of a volume of the lead gap.

8. The semiconductor device of claim 1, wherein
the insulation sheet is made of a material having a glass transition temperature higher than or equal to 160° C. and equal to or lower than 200° C.

9. The semiconductor device of claim 1, wherein the insulation sheet is made of a polyimide resin.

10. The semiconductor device of claim 1, wherein the semiconductor element is a power element.

11. The semiconductor device of claim 1, wherein the distal end of the portion of the insulation sheet is located at a middle position of the through hole or a middle position of the lead gap.

* * * * *